United States Patent
Tang et al.

(10) Patent No.: US 8,816,445 B2
(45) Date of Patent: Aug. 26, 2014

(54) POWER MOSFET DEVICE WITH A GATE CONDUCTOR SURROUNDING SOURCE AND DRAIN PILLARS

(71) Applicant: PTek Technology Co., Ltd., Hsinchu (TW)

(72) Inventors: Ming Tang, Hsinchu (TW); Shih Ping Chiao, Hsinchu (TW)

(73) Assignee: Ptek Technology Co., Ltd., Hsinchu (TW)

( * ) Notice: Subject to any disclaimer, the term of this patent is extended or adjusted under 35 U.S.C. 154(b) by 13 days.

(21) Appl. No.: 13/740,898

(22) Filed: Jan. 14, 2013

(65) Prior Publication Data

US 2014/0197475 A1  Jul. 17, 2014

(51) Int. Cl.
*H01L 29/06* (2006.01)

(52) U.S. Cl.
CPC ........ *H01L 29/0696* (2013.01); *H01L 29/0692* (2013.01)
USPC .................... 257/401; 257/335; 257/E29.027

(58) Field of Classification Search
CPC .......................... H01L 29/0696; H01L 29/0692
USPC .................................. 257/335, 401, E29.027
See application file for complete search history.

(56) References Cited

U.S. PATENT DOCUMENTS

| 7,033,891 B2 | 4/2006 | Wilson et al. |
| 2006/0273383 A1 | 12/2006 | Hshieh |
| 2008/0116510 A1 | 5/2008 | Kocon et al. |

FOREIGN PATENT DOCUMENTS

TW  304302  5/1997

OTHER PUBLICATIONS

Abstract translation of TW304302, Creation/Publication Date: May 1, 1997.

*Primary Examiner* — Amar Movva
(74) *Attorney, Agent, or Firm* — WPAT, P.C.; Anthony King

(57) ABSTRACT

A power MOSFET device includes at least one MOSFET unit disposed over a substrate, wherein the MOSFET unit includes a plurality of cells and a boundary surrounding the cells. In one embodiment of the present invention, the cell is configured to provide a unit current, and comprises at least one source pillar and at least one drain pillar, a gate conductor surrounding the source pillar and the drain pillar, and an insulating structure electrically separating the gate conductor from the source pillar and the drain pillar, wherein the gate conductor extends from the cell to the boundary.

22 Claims, 18 Drawing Sheets

POWER MOSFET DEVICE WITH A GATE CONDUCTOR SURROUNDING SOURCE AND DRAIN PILLARS

BACKGROUND

1. Technical Field

The present invention relates to a power MOSFET device, and more particularly, to a power MOSFET device with a gate conductor surrounding source and drain pillar.

2. Description of Related Arts

Power MOS transistors are a specific type of MOS transistor used for providing and switching power in an integrated circuit. Accordingly, power MOS transistors must be able to work normally under high voltage. Therefore, it is typical for a power MOS transistor cell manufactured by a CMOS process to be of a larger size in order to is be capable of operations under high voltage. On the other hand, it is also a requirement for power MOS transistors to be able to output large currents. Therefore, it is also typical to combine a large number of power MOS transistor cells into a single power MOS transistor, wherein at least one power MOS transistor cell outputs a relatively small amount of current. However, such a power MOS transistor must be very large, which may be unacceptable in view of manufacturing requirements nowadays.

There are many published documents disclosing improved power MOSFET structure. For example, TW304302 discloses an improved planar power MOSFET structure with a sidewall spacer for reducing gate-source overlapping caused by lateral diffusion, U.S. Pat. No. 7,033,891 discloses a MOSFET device for RF applications that uses a trench gate in place of the lateral gate used in lateral MOSFET devices, and US 2008/0116510 discloses an improved trench MOS-gated device having a buried gate.

SUMMARY

One aspect of the present invention provides a power MOSFET device with a gate conductor surrounding source and drain pillar A power MOSFET device according to this aspect of the present invention comprises at least one MOSFET unit disposed over a substrate, wherein the MOSFET unit comprises a plurality of cells and a boundary surrounding the cells. In one embodiment of the present invention, each cell of the plurality of cells is configured to provide a unit current, and comprises: at least one source pillar and at least one drain pillar; a gate conductor surrounding the source pillar and the drain pillar, and extending form the cell to the boundary; and an insulating structure electrically separating the gate conductor from the source pillar and the drain pillar.

Another aspect of the present invention provides a power MOSFET device having a plurality of MOSFET units with different numbers of cells. The power MOSFET device may comprise a plurality of MOSFET units with different numbers of cells to provide different amounts of currents by electrically connecting the cells of different MOSFET units to be parallel to each other.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not is depart from the spirit and scope of the invention as set forth in the appended claims.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIG. 14 to FIG. 18 are cross-sectional views of the cell according to one embodiment of the present invention.

DETAILED DESCRIPTION

The following description of the invention accompanies drawings, which are incorporated in and constitute a part of this specification, and illustrate embodiments of the invention, but the invention is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the invention so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present invention is directed to a power MOSFET device. In order to make the present invention completely comprehensible, detailed steps and structures are provided in the following description. Obviously, implementation of the present invention does not limit special details known by persons skilled in the art. In addition, known structures and steps are not described in detail, so as not to limit the present invention unnecessarily. Preferred embodiments of the present invention will be described below in detail. However, in addition to the detailed description, the present invention may also be widely implemented in other embodiments. The scope of the present invention is not limited to the detailed description, and is defined by the claims.

Figure 1:
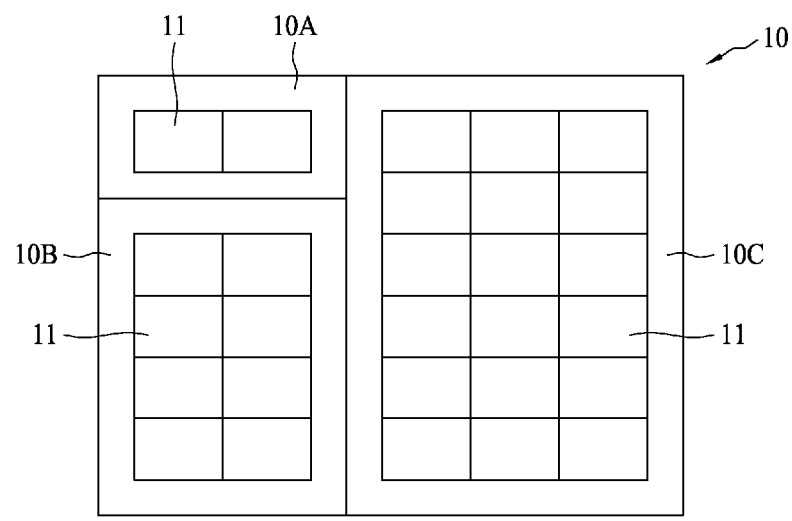
FIG. 1 is a top view of a power MOSFET device according to one embodiment of the present invention.

FIG. 1 is a top view of a power MOSFET device 10 according to one embodiment of the present invention. In one embodiment of the present invention, the power MOSFET device 10 comprises a plurality of MOSFET units 10A, 10B, 10C, and at least one MOSFET unit of the plurality of MOSFET units 10A, 10B, 10C comprises a plurality of cells 11. In one embodiment of the present invention, the plurality of MOSFET units 10A, 10B, 10C have different numbers of cells 11, and each cell 11 is configured to provide a unit current. In an exemplary is embodiment of the present invention, the MOSFET unit 10A comprises two cells 11 to provide a two-unit current; the MOSFET unit 10B comprises eight cells 11 to provide an eight-unit current; and the MOSFET unit 10C comprises eighteen cells 11 to provide an eighteen-unit current.

Figure 2:
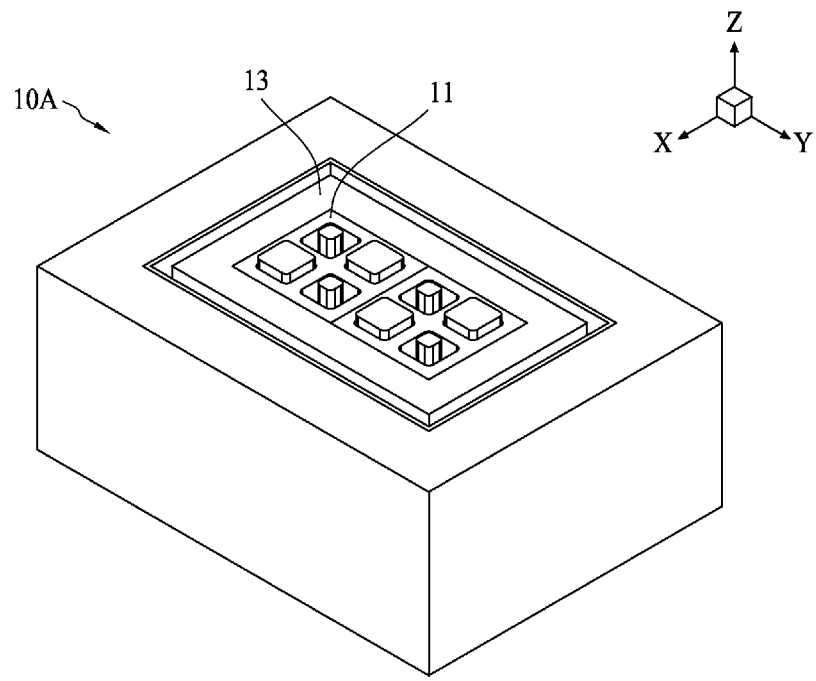
FIG. 2 is a full view of the MOSFET unit in the power MOSFET device according to one embodiment of the present invention.
Figure 3:
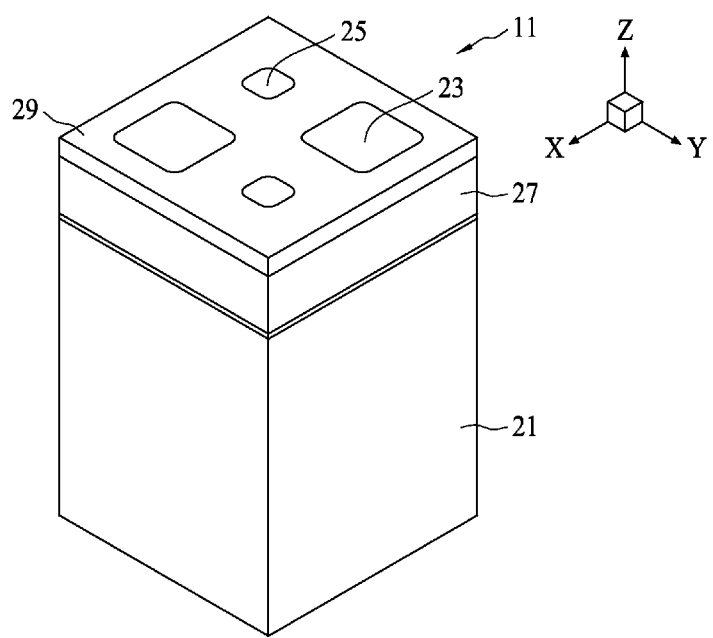
FIG. 3 to FIG. 6 are full views of the cell in the MOSFET unit 10A according to one embodiment of the present invention.
Figure 4:
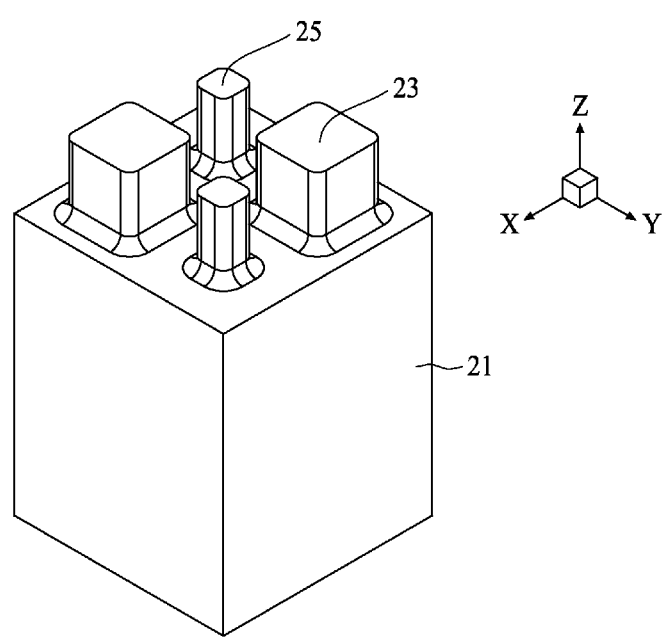
Figure 5:
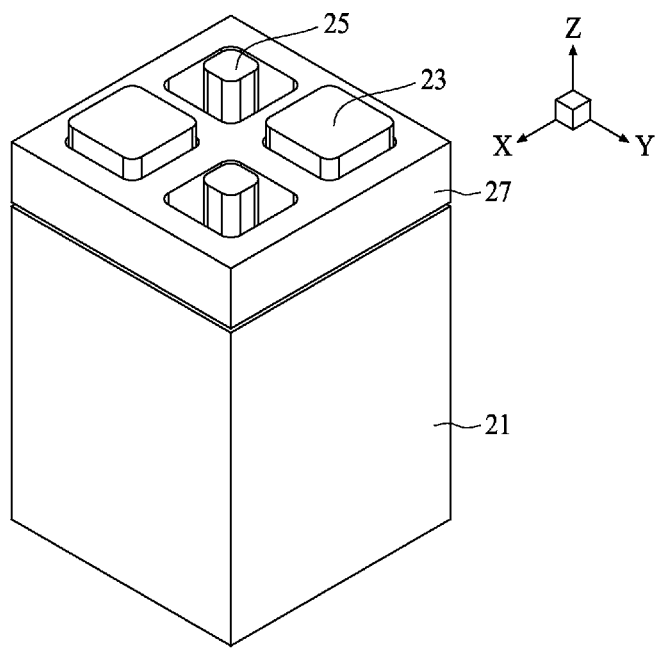
Figure 6:
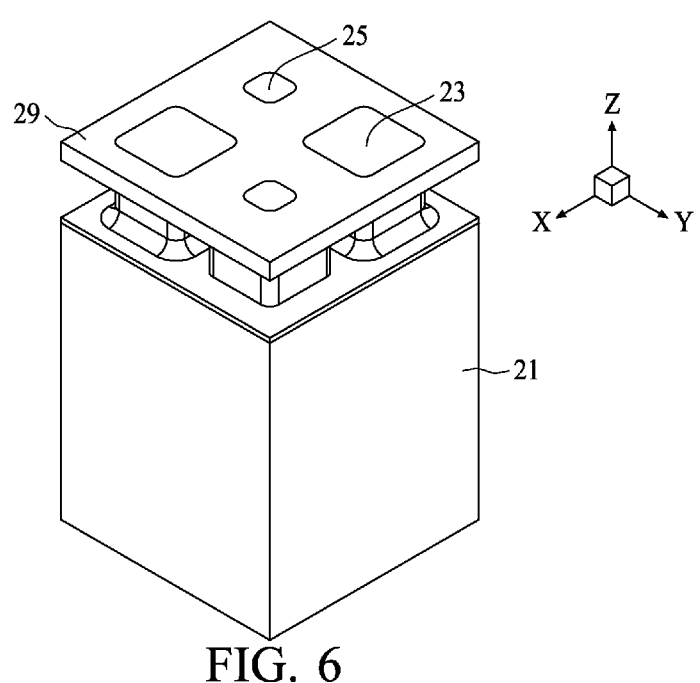

FIG. 2 is a full view of the MOSFET unit 10A in the power MOSFET device 10 according to one embodiment of the present invention. In one embodiment of the present invention, the MOSFET unit 10A comprises two cells 11 and a boundary 13 surrounding the two cells 11, and the MOSFET unit 10B and the MOSFET unit 10C have a similar structure.

FIG. 3 to FIG. 6 are full views of the cell 11 in the MOSFET unit 10A according to one embodiment of the present invention. In an exemplary embodiment of the present invention, the cell 11 of the MOSFET unit 10A comprises a substrate 21; at least one source pillar 23 and at least one drain pillar disposed over the substrate 21; a gate conductor 27 surrounding the source pillar 23 and the drain pillar 25; and an insulating structure 29 electrically separating the gate conductor 27 from the source pillar 23 and the drain pillar 25.

In an exemplary embodiment of the present invention, the source pillar 23 has a first width, and the drain pillar 25 has a second width smaller than the first width. In a preferred embodiment of the present invention, the MOSFET unit 10A is rectangular; the cell 11 of the MOSFET unit 10A comprises two source pillars 23 and two drain pillars 25 disposed over the substrate 21 in an interlaced manner; and is the MOSFET units 10B and 10C have a similar structure.

Figure 7:
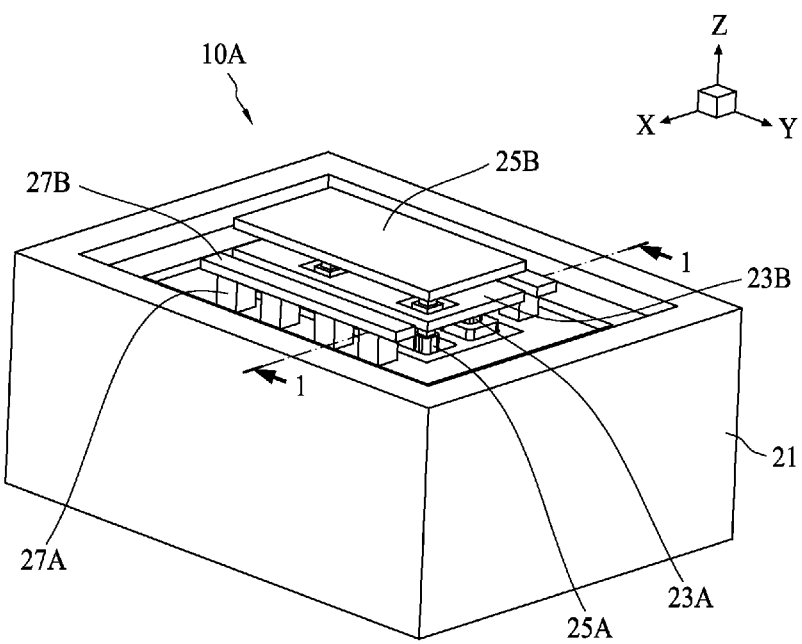
FIG. 7 is a full view of the MOSFET unit in the power MOSFET device according to one embodiment of the present invention.
Figure 8:
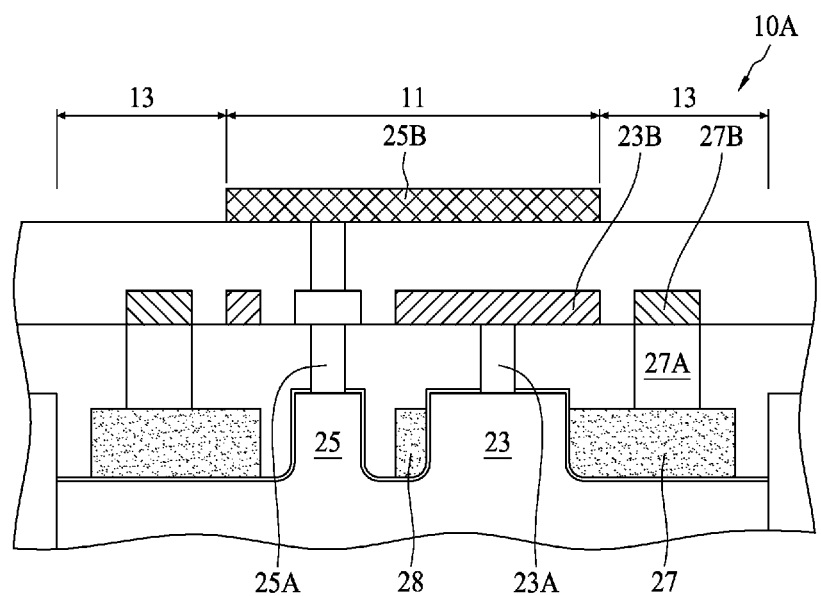
FIG. 8 is a cross-sectional view of the MOSFET unit along the cross-sectional line 1-1 in FIG. 7 according to one embodiment of the present invention

FIG. 7 is a full view of the MOSFET unit 10A in the power MOSFET device 10 according to one embodiment of the present invention, and FIG. 8 is a cross-sectional view of the MOSFET unit 10A along the cross-sectional line 1-1 in FIG. 7 according to one embodiment of the present invention. In an exemplary embodiment of the present invention, the MOSFET unit 10A comprises: a source pad 23B disposed in the cell 11 and connected to the plurality of the source pillars 23 via a source plug 23A; and a drain pad 25B disposed in the cell 11 and connected to the plurality of the drain pillars 25 via a drain plug structure 25A.

In an exemplary embodiment of the present invention, the gate conductor 27 extends from the cell 11 to the boundary 13 and comprises a trench-type gate 28 disposed between the source pillar 23 and the drain pillar 25. In one embodiment of the present invention, the MOSFET unit 10A comprises: a plurality of gate plugs 27A disposed in the boundary 13 and connected to the gate conductor 27 in the boundary 13; and two gate pads 27B disposed in the boundary 13 and connected to the plurality of the gate contacts 27B in the boundary 13.

Figure 9:
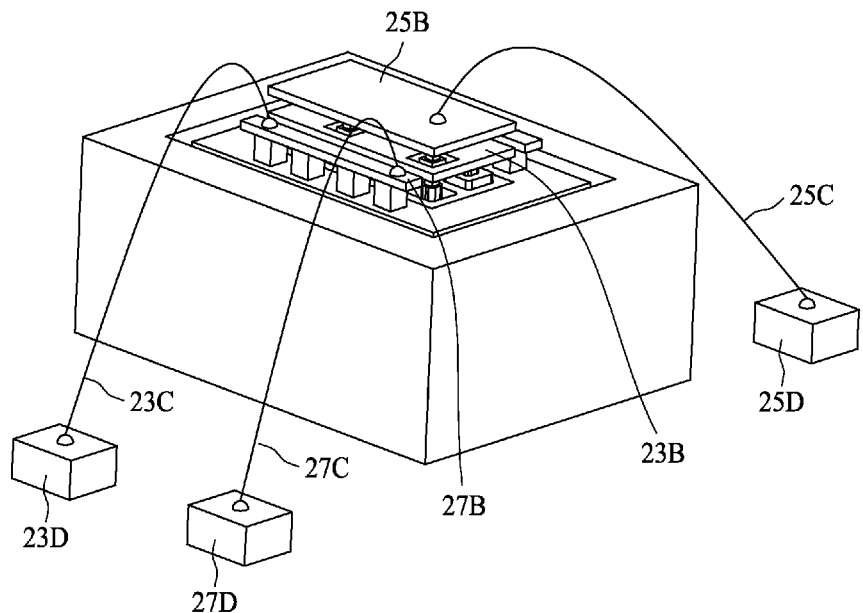
FIG. 9 and FIG. 10 are schematic diagrams of the power MOSFET device according to one embodiment of the present invention.
Figure 10:
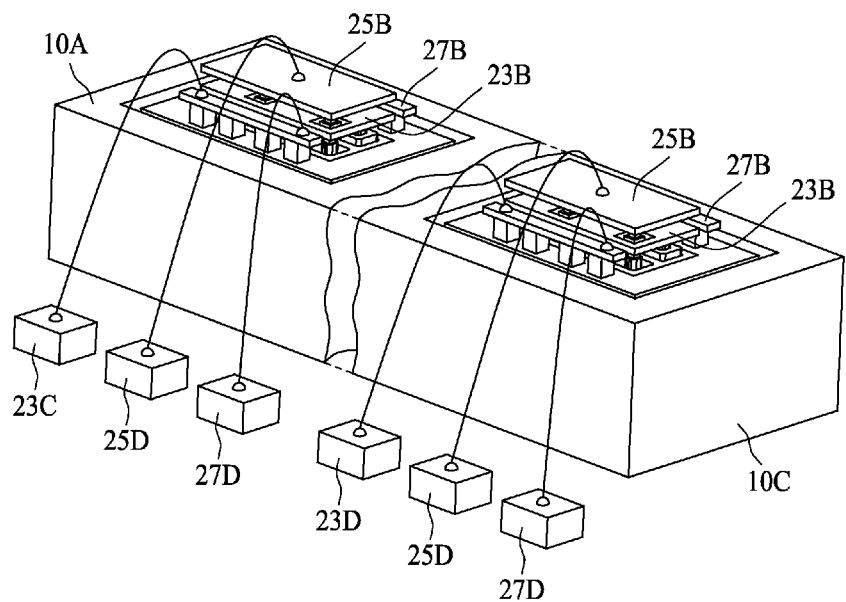

FIG. 9 and FIG. 10 are schematic diagrams of the power MOSFET device 10 according to one embodiment of the present invention. In one embodiment of the present invention, the power MOSFET device 10 further comprises: a source wire 23C electrically connecting the source pad 23B of the MOSFET unit 10A to a source is pad 23D; a drain wire 25C electrically connecting the drain pad 25B of the MOSFET unit 10A to a drain pad 25D; and a gate wire 25C electrically connecting the gate pad 27B of the MOSFET unit to a gate pad 27D. In an exemplary embodiment of the present invention, the source pad 23D, the drain pad 25D and the gate pad 27D can be bonding pads on a base such as a lead frame or a printed circuit board.

As shown in FIG. 10, in one exemplary embodiment of the present invention, the MOSFET units 10A and 10C are connected in parallel by the wires 23C, 25C and 25D to the source pad 23D, the drain pad 25D and the gate pad 27D of a lead frame or a printed circuit board. In another exemplary embodiment of the present invention, the plurality of MOSFET units 10A, 10B and 10C can be connected in parallel by the wires 23C, 25C and 25D to output four different amounts of currents. For example, the MOSFET unit 10A and the MOSFET unit 10B can be connected in parallel to output a ten-unit current; the MOSFET unit 10B and the MOSFET unit 10C can be connected in parallel to output a twenty-six unit current; the MOSFET unit 10A and the MOSFET unit 10C can be connected to output a twenty-unit current; and the MOSFET unit 10A, the MOSFET unit 10B and the MOSFET unit 10C can be connected in parallel to output a twenty-eight unit current.

Figure 11:
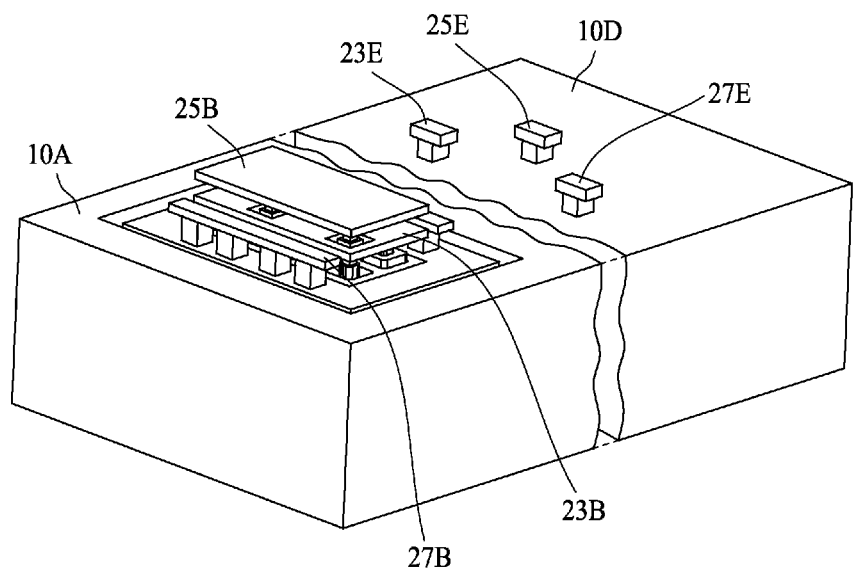
FIG. 11 is a schematic diagram of the power MOSFET device according to one embodiment of the present invention.

FIG. 11 is a schematic diagram of the power MOSFET device 10 according to one embodiment of the present invention. In one embodiment of the present invention, the power MOSFET device 10 further comprises a control circuit 10D with a source pad 23E, a drain pad 25E and a gate pad 27E. In one exemplary embodiment of the is present invention, the source pad 23E, the drain pad 25E and the gate pad 27E of the control circuit 10D are electrically connected to the source pad 23C, the drain pad 25C and the gate pad 27C in the MOSFET units 10A, 10B and 10C. Consequently, the control circuit 10D can directly control the amount of the output current of the power MOSFET device 10 by turning on or turning off the MOSFET units to provide the desired current.

Figures 12, 13, 14:
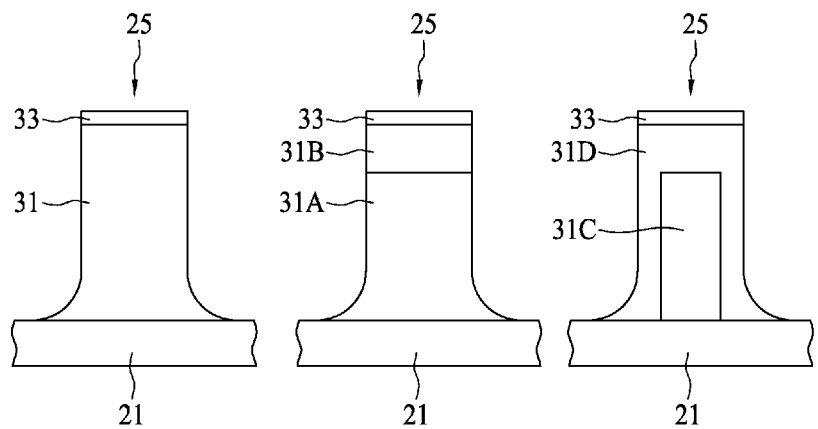
FIG. 12 to FIG. 14 are cross-sectional views of the drain pillar according to one embodiment of the present invention.

FIG. 12 to FIG. 14 are cross-sectional views of the drain pillar 25 according to one embodiment of the present invention. Referring to FIG. 10, in one embodiment of the present invention, the drain pillar 25 can be implemented by a body 31 and a metal silicide layer 33 disposed over the body 31. In an exemplary embodiment of the present invention, the body 31 is made of silicon with heavily doped N-type or P-type dopants. Referring to FIG. 13, in another exemplary embodiment of the present invention, the body 31 of the drain pillar 25 can be implemented by a lower portion 31A having a first doping concentration of a first conductivity type and an upper portion 31B having a second doping concentration of the first conductivity type disposed over the lower portion 31A, wherein the second doping concentration is higher than the first doping concentration. Referring to FIG. 14, in another exemplary embodiment of the present invention, the body 31 of the drain pillar 25 can be implemented by a central portion 31C and a cap portion 31D that covers the central portion 31C, wherein the central portion 31C has a first doping concentration of a first conductivity type, the cap portion 31D has a second doping concentration of a second conductivity type, and the second doping is concentration is higher than the first doping concentration.

Figure 15:
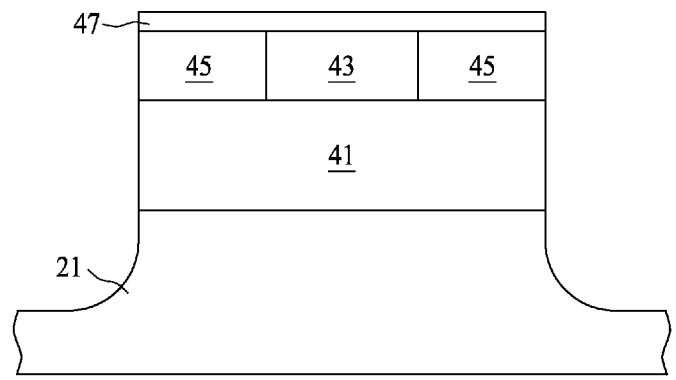
FIG. 15 is a cross-sectional view of the source pillar according to one embodiment of the present invention.
Figure 16:
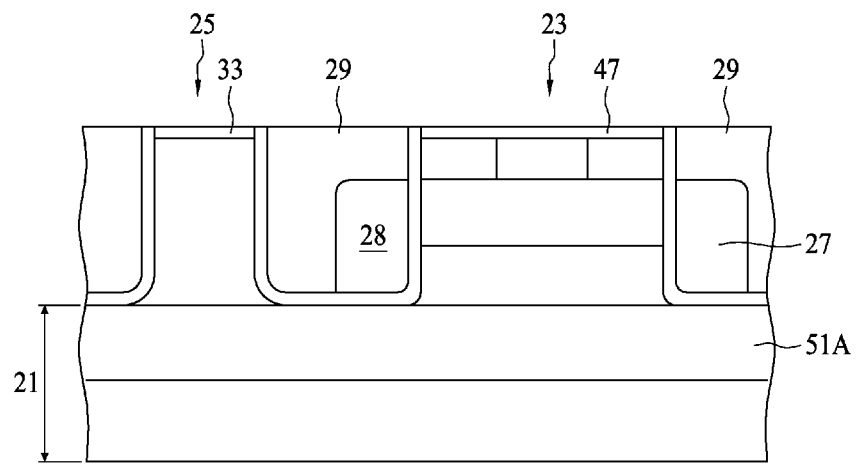

FIG. 15 is a cross-sectional view of the source pillar 23 according to one embodiment of the present invention. In an exemplary embodiment of the present invention, the source pillar 23 comprises: a well portion 41; a central portion 43 of a first conductivity type that is disposed over the well portion 41; a wall portion 45 of a second conductivity type that is surrounding the central portion 43; and a metal silicide layer 47 disposed over the central portion 43 and the wall portion 45.

Figure 17:
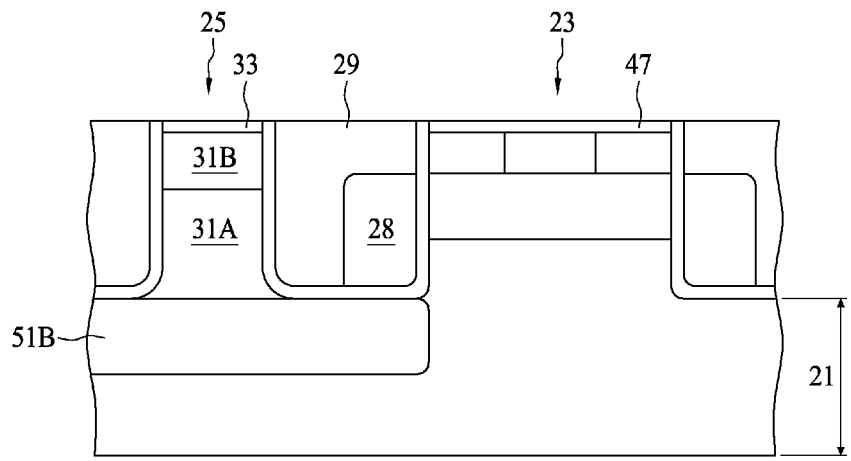
Figure 18:
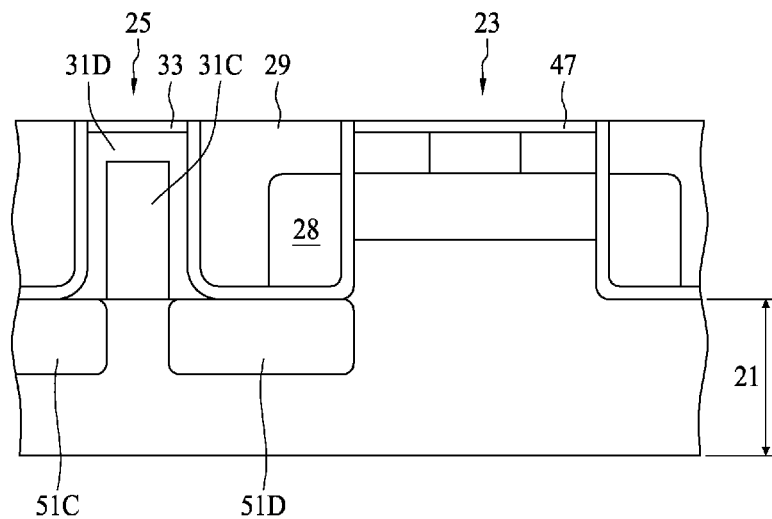

FIG. 14 to FIG. 18 are cross-sectional views of the cell 10A according to one embodiment of the present invention. Referring to FIG. 14, in an exemplary embodiment of the present invention, the substrate 21 comprises a double diffusion doping region MA disposed below both the source pillar 23 and the drain pillar 25. Referring to FIG. 17, in an exemplary embodiment of the present invention, the substrate 21 comprises a double diffusion doping region 51B disposed below the drain pillar 25 and the trench-type gate 28. Referring to FIG. 18, in another exemplary embodiment of the present invention, the substrate 21 comprises a first double diffusion 51C region disposed below the drain pillar 25 and a second double diffusion doping region 51D disposed below the trench-type gate 28. In another exemplary embodiment of the present invention, the doping concentration in an upper portion of the double diffusion doping region is higher than the doping concentration in a lower portion of the double diffusion doping region.

In an exemplary embodiment of the present invention, the insulating structure 29 has a first thickness between the trench-type gate 28 and the drain pillar 25 and a second thickness between the trench-type gate 28 and the source pillar 23, in which the second thickness is smaller than the first thickness. In an exemplary embodiment of the present invention, the insulating structure 29 has a first thickness over the trench-type gate 28 and a second thickness below the trench-type gate 28, in which the second thickness is smaller than the first thickness. In an exemplary embodiment of the present invention, the uppermost surface of the trench-type gate 28 is lower than an uppermost surface of the source pillar 23. In a preferred embodiment of the present invention, the uppermost surface of the trench-type gate 28 is lower than both the metal silicide layer 33 of the drain pillar 25 and the metal silicide layer 47 of the source pillar 23.

Figure 19:
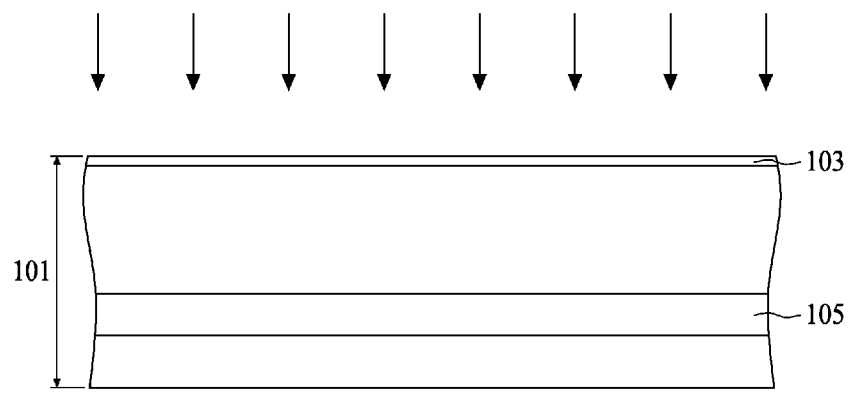
FIG. 19 to FIG. 38 illustrate a method for fabricating a power MOSFET device according to one embodiment of the present invention.

FIG. 19 to FIG. 38 illustrate a method for fabricating a power MOSFET device 110 according to one embodiment of the present invention. Referring to FIG. 19, an implanting process is performed on a silicon substrate 101 with a silicon oxide layer 103 to form a double diffusion doping region 105, and a surface oxidation process is then performed to improve the quality of the silicon oxide layer 103.

Figure 20:
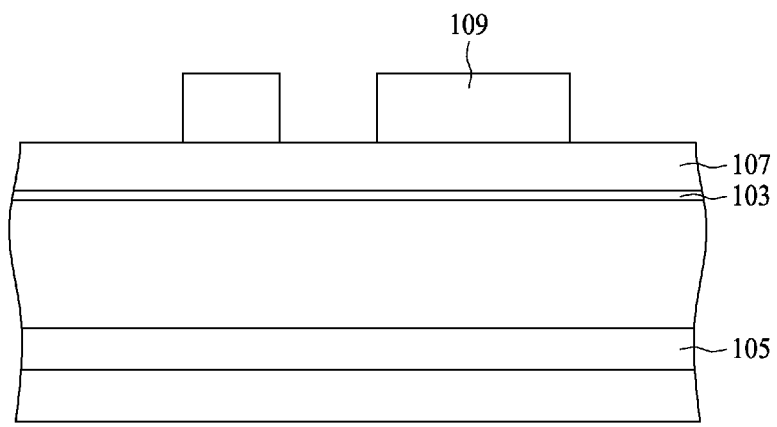

Referring to FIG. 20, a deposition process is performed to form a silicon nitride layer 107 on the silicon oxide layer 103, and a photolithographic process is then performed to form a photoresist pattern 109 on the silicon nitride layer 107.

Figure 21:
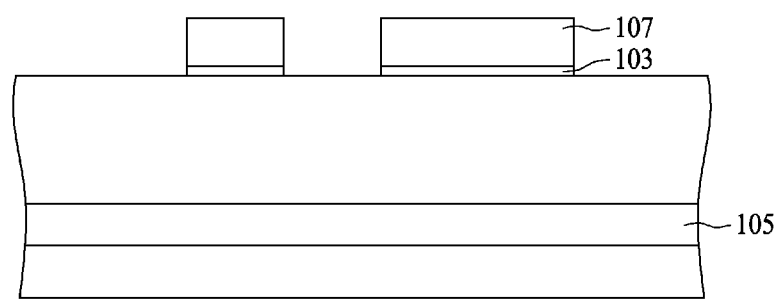

Referring to FIG. 21, a dry etching process is performed to remove a portion of the silicon nitride layer 107 and the silicon oxide layer 103 not covered by the photoresist pattern 109, and the photoresist pattern 109 is then removed.

Figure 22:
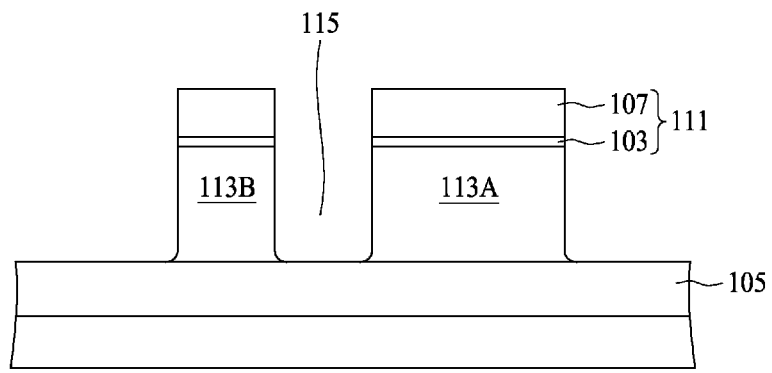

Referring to FIG. 22, the remaining portions of the silicon nitride layer 107 and the silicon oxide layer 103 are used as a hard mask 111, and a dry etching process is then performed to remove a portion of the silicon substrate 101 so as to form a source pillar 113A and drain pillar 113B, with a trench 115 between the source pillar 113A and the drain pillar 113B.

Figure 23:
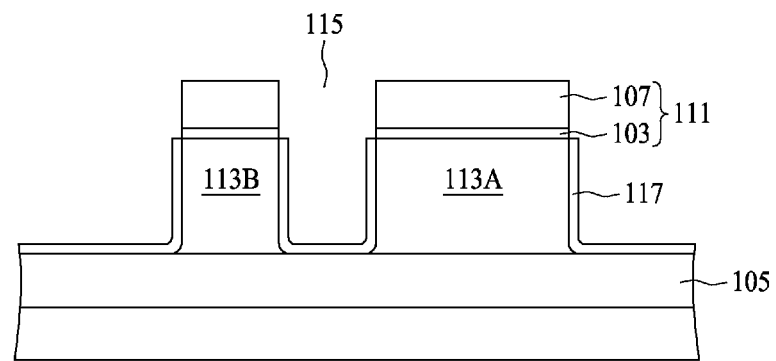

Referring to FIG. 23, a dielectric layer 117 is formed on the sidewalls of the source pillar 113A and the drain pillar 113B. In one embodiment of the present invention, the dielectric layer 117 is formed by a thermal oxidation process and serves as a gate oxide.

Figure 24:
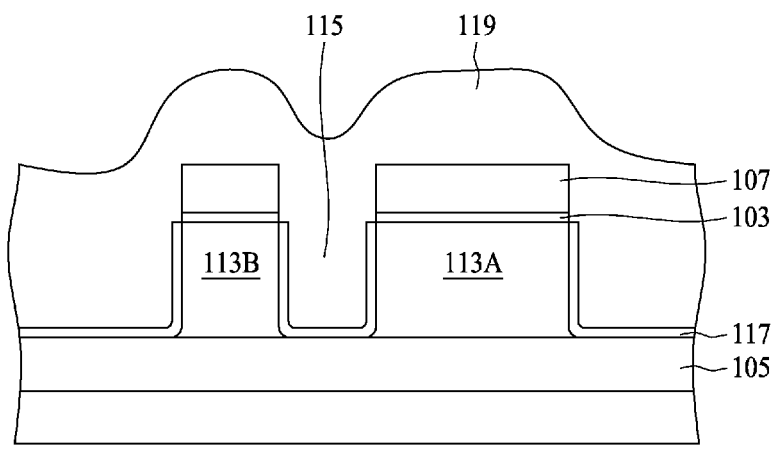

Referring to FIG. 24, a deposition process is performed to form a conductive layer 119, which fills the trench 115 and covers the source pillar 113A and the drain pillar 113B. In one embodiment of the present invention, the conductive layer 119 comprises poly-silicon, which serves as a gate conductor.

Figure 25:
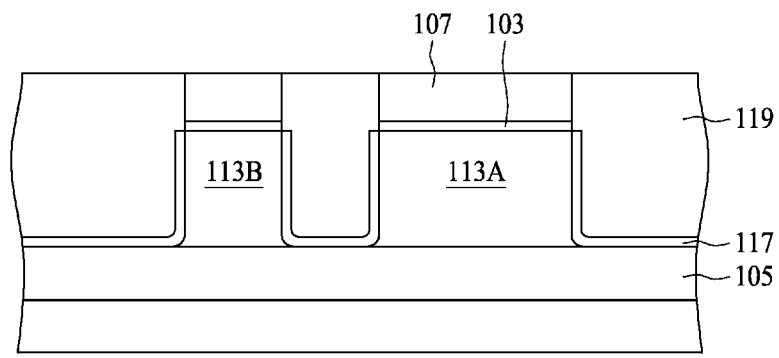

Referring to FIG. 25, a planarization process is performed to move a portion of the conductive layer 119 above the silicon nitride layer 107. In one embodiment of the present invention, the planarization process is a chemical mechanical polishing (CMP) process.

Figure 26:
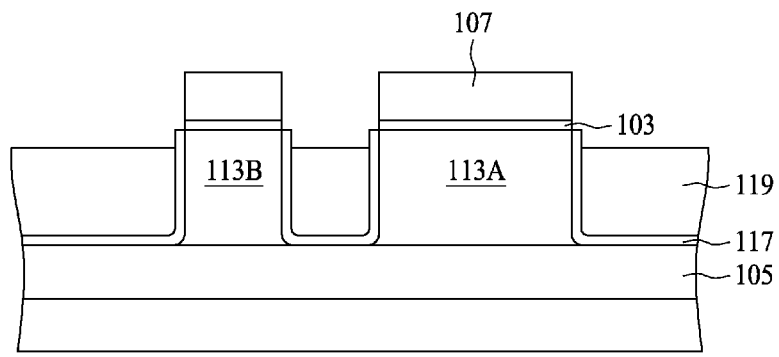

Referring to FIG. 26, an etching back process is performed to further remove a portion of the conductive layer 119 such that the uppermost surface of the conductive layer 119 is lower than the uppermost surfaces of the source pillar 113A and the drain pillar 113B. In one embodiment of the present invention, the etching back process is a dry etching process.

Figure 27:
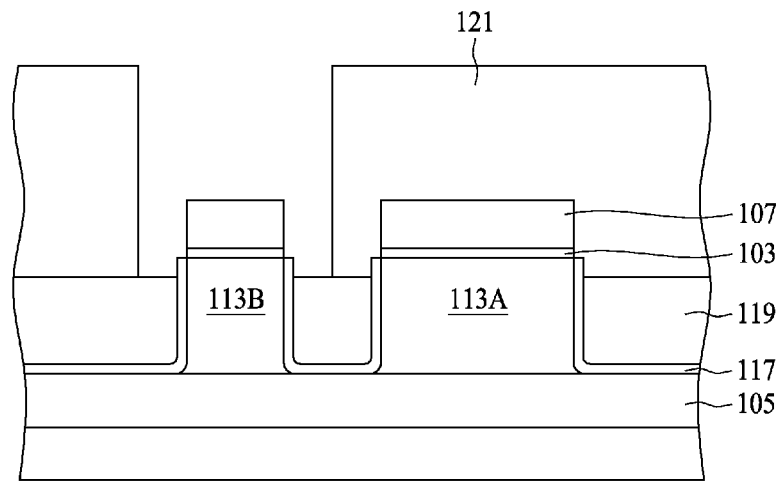

Referring to FIG. 27, a photolithographic process is performed to form a photoresist pattern 121 covering the source pillar 113A, while exposing the drain pillar 113B and a portion of the conductive layer 119.

Figure 28:
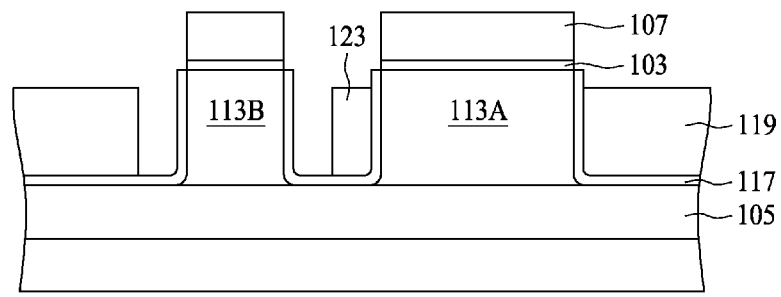

Referring to FIG. 28, a dry etching process is performed to remove a portion of the conductive layer 119 not covered by the photoresist pattern 121 and the hard mask 111 to form a trench-type gate 123. The photoresist pattern 121 is then stripped.

Figure 29:
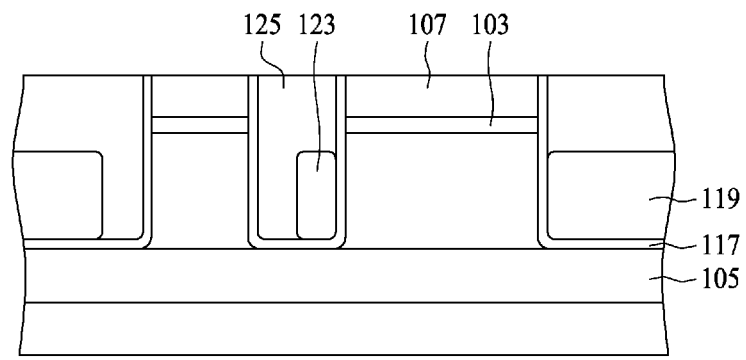

Referring to FIG. 29, a deposition process is performed to form a dielectric layer 125, and a planarization process is performed to move a portion of the dielectric layer 125 above the silicon nitride layer 107. In one embodiment of the present invention, the planarization process is a chemical mechanical polishing (CMP) process.

Figure 30:
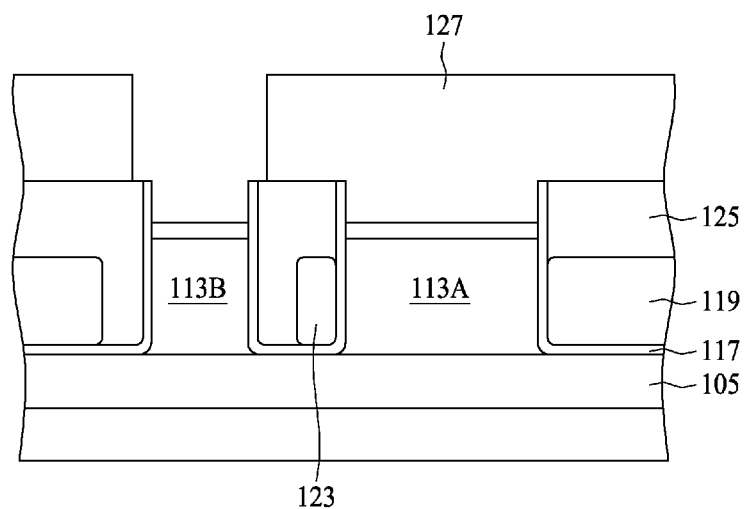

Referring to FIG. 30, the silicon nitride layer 107 is removed, and a photolithographic process is then performed to form a photoresist pattern 127, which covers the source pillar 113A while exposing the drain pillar 113B.

Figure 31:
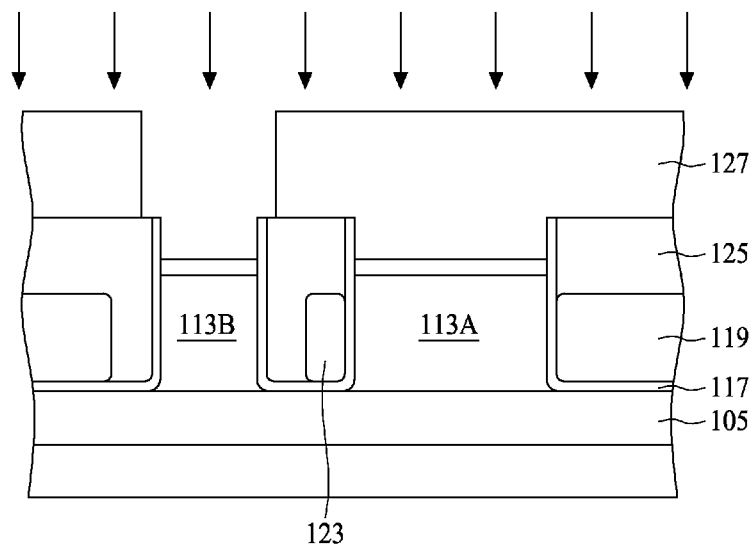

Referring to FIG. 31, an implanting process is performed to implant dopants into the exposed drain pillar 113B.

Figure 32:
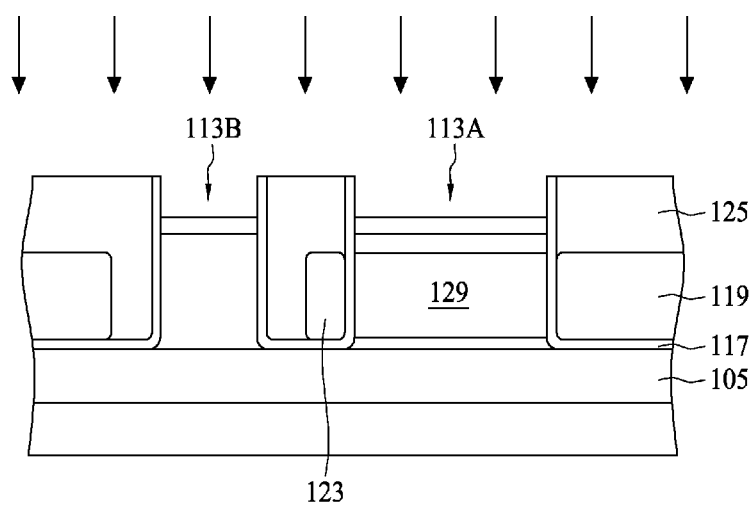

Referring to FIG. 32, the photoresist pattern 127 is stripped, and an implanting process is performed to implant dopants into the source pillar 113A to form a well portion 129.

Figure 33:
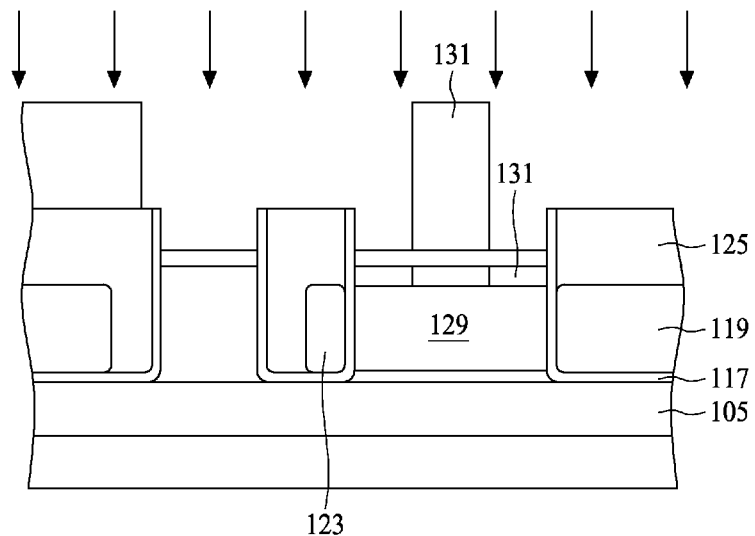

Referring to FIG. 33, a photolithographic process is performed is to form a photoresist pattern 131 covering a central portion of the source pillar 113A, and an implanting process is then performed to implant dopants of a first conductivity type into the source pillar 113A so as to form a wall portion 131.

Figure 34:
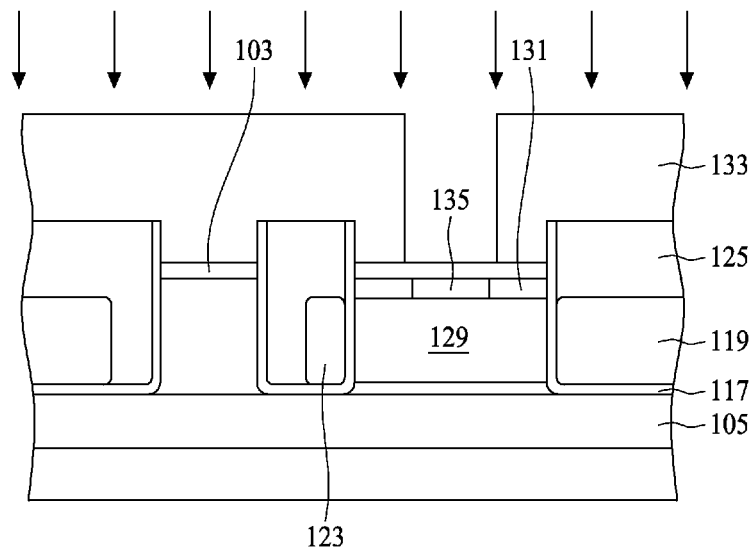

Referring to FIG. 34, the photoresist pattern 131 is stripped. Subsequently, a photolithographic process is performed to form a photoresist pattern 133 exposing a central portion of the source pillar 113A, and an implanting process is then performed to implant dopants of a second conductivity type into the source pillar 113A so as to form a central portion 135.

Figure 35:
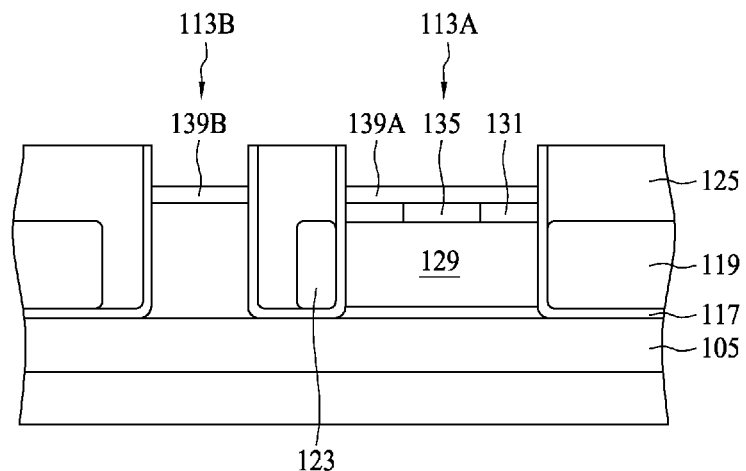

Referring to FIG. 35, the photoresist pattern 133 is stripped, and an etching back process is performed to remove the silicon oxide layer 103 from both the source pillar 113A and the drain pillar 113B. Subsequently, a metal silicide layer 139A is formed on the source pillar 113A and a metal silicide layer 139B is formed on the drain pillar 113B.

Figure 36:
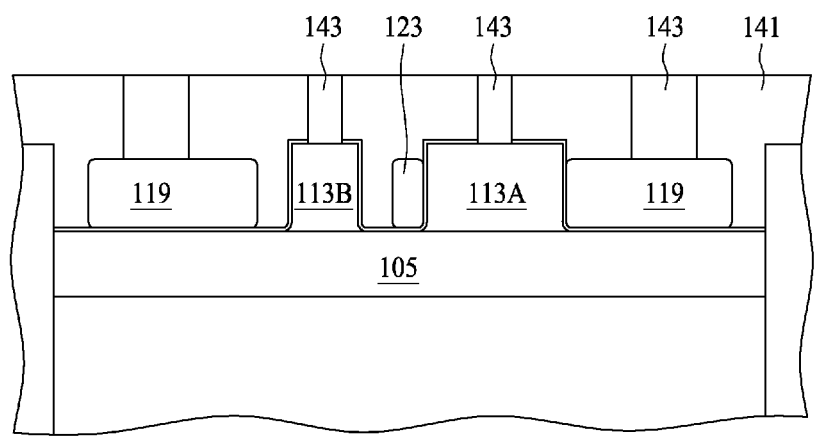

Referring to FIG. 36, a deposition process is performed to form an inter-metal dielectric layer 141, and via holes 143 are then formed in the inter-metal dielectric layer 141 by photolithographic and etching processes.

Figure 37:
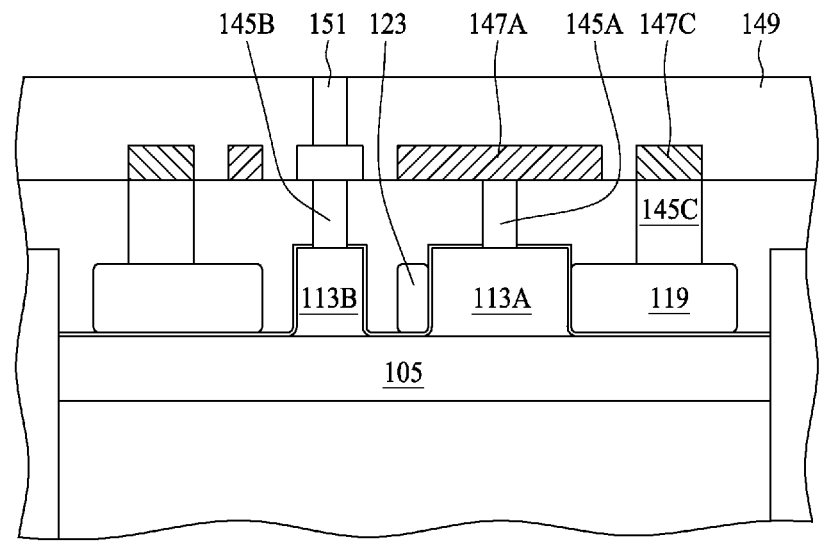

Referring to FIG. 37, a source plug 145A, such as a tungsten plug, is formed in the via holes 143 on the source pillar 113A, a drain plug 145B, such as the tungsten plug, is formed in the via holes 143 on the drain pillar 113B, and a gate plug 145C is formed in the via holes 143 on the conductive layer 119 serving as the gate conductor. Subsequently, a source pad 147A and a gate pad 147C are formed on the inter-metal dielectric layer 141; a deposition process is then performed to form a dielectric layer 149; and a via hole 151 is formed in the dielectric layer 149 by photolithographic and etching processes.

Figure 38:
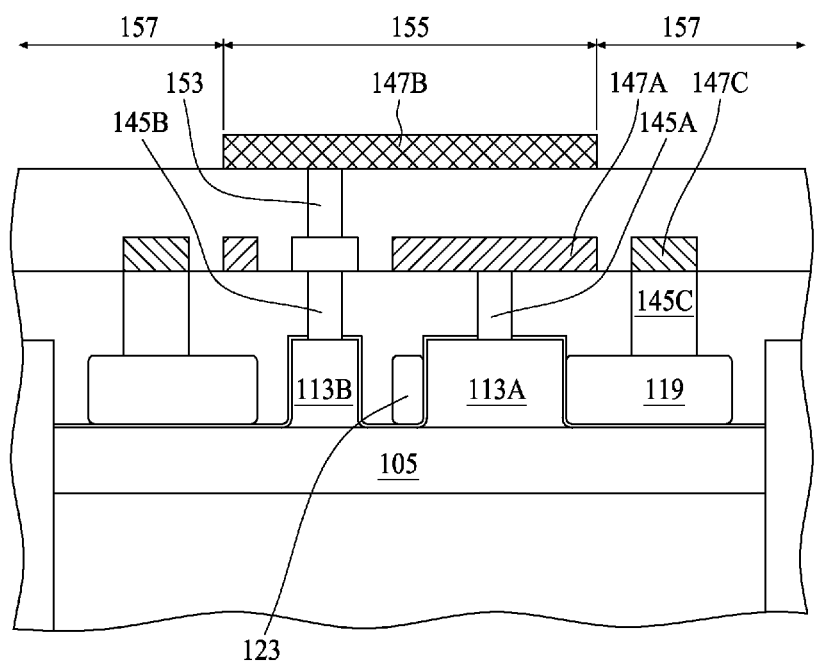

Referring to FIG. 38, a drain plug 153, such as the tungsten plugs, is formed in the via hole 151 of the dielectric layer 149. Subsequently, a drain pad 147B is formed on the dielectric layer 149 by the deposition, lithographic and etching processes. In one embodiment of the present invention, the source plug 145A and the source pad 147A are formed in a cell 155, and the drain plug (145B and 153) and the pad 147B are formed in the cell 155 The gate plug 145C and the gate pad 147C are formed in a boundary surrounding the cell 155.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the invention of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A power MOSFET device, comprising:
   at least one MOSFET unit disposed over a substrate, comprising:
      at least one cell and a boundary surrounding the cell, and the cell including at least one source pillar and at least one drain pillar;
      a gate conductor surrounding the source pillar and the drain pillar, and extending from the cell to the boundary; and
      an insulating structure electrically separating the gate conductor from the source pillar and the drain pillar.

2. The power MOSFET device of claim 1, wherein the source pillar has a first width, and the drain pillar has a second width smaller than the first width.

3. The power MOSFET device of claim 1, wherein the MOSFET unit is rectangular, and includes a plurality of the source pillars and drain pillars disposed in an interlaced manner.

4. The power MOSFET device of claim 1, wherein the gate conductor comprises a trench-type gate disposed between the source pillar and the drain pillar.

5. The power MOSFET device of claim 1, wherein the MOSFET unit comprises:
   a plurality of the source pillars; and
   a source pad connected to the plurality of source pillars.

6. The power MOSFET device of claim 5, further comprising a source wire connected to the source pad of the MOSFET unit.

7. The power MOSFET device of claim 1, wherein the MOSFET unit comprises:
   a plurality of drain pillars; and
   a drain pad connected to the plurality of drain pillars.

8. The power MOSFET device of claim 7, further comprising a drain wire connected to the drain pad of the MOSFET unit.

9. The power MOSFET device of claim 1, wherein the MOSFET unit comprises:
   a plurality of gate contacts connected to the gate conductor at the boundary; and
   is at least one gate pad connected to at least a portion of the plurality of gate contacts at the boundary.

10. The power MOSFET device of claim 9, further comprising a gate wire connected to the gate pad of the MOSFET unit.

11. The power MOSFET device of claim 1, wherein the drain pillar comprises a body and a metal silicide layer disposed over the body.

12. The power MOSFET device of claim 11, wherein the body comprises:
    a lower portion having a first doping concentration; and
    an upper portion having a second doping concentration disposed over the lower portion;
    wherein the second doping concentration is higher than the first doping concentration.

13. The power MOSFET device of claim 11, wherein the body comprises:
    a central portion having a first doping concentration; and
    a cap portion having a second doping concentration and covering the central portion;
    wherein the second doping concentration is higher than the first doping concentration.

14. The power MOSFET device of claim 1, wherein the source pillar comprises:
    is a well portion;
    a central portion of the first conductivity type and disposed over the well portion;
    a wall portion of a second conductivity type and surrounding the central portion; and
    a metal silicide layer disposed over the central portion and the wall portion.

15. The power MOSFET device of claim 1, wherein the substrate comprises a double diffusion doping region disposed below the source pillar and the drain pillar.

16. The power MOSFET device of claim 1, wherein the gate conductor comprises a trench-type gate disposed between the source pillar and the drain pillar, and the substrate comprises a double diffusion doping region disposed below the drain pillar and the trench-type gate.

17. The power MOSFET device of claim 1, wherein the gate conductor comprises a trench-type gate disposed between the source pillar and the drain pillar, and the substrate comprises a first double diffusion doping region disposed below the drain pillar and a second double diffusion doping region disposed below the trench-type gate.

18. The power MOSFET device of claim 1, wherein the gate conductor comprises a trench-type gate disposed between the source pillar and the drain pillar, in which the insulating structure has a first is thickness between the trench-type gate and the drain pillar and a second thickness between the trench-type gate and the source pillar, and the second thickness is smaller than the first thickness.

19. The power MOSFET device of claim 1, wherein the gate conductor comprises a trench-type gate disposed between the source pillar and the drain pillar, in which the insulating structure has a first thickness over the trench-type gate and a second thickness below the trench-type gate, and the second thickness is smaller than the first thickness.

20. The power MOSFET device of claim 1, wherein the gate conductor comprises a trench-type gate disposed between the source pillar and the drain pillar, and an uppermost surface of the trench-type gate is lower than an uppermost surface of the source pillar.

21. The power MOSFET device of claim 1, comprising a plurality of MOSFET units having different numbers of cells.

22. The power MOSFET device of claim 21, further comprising a plurality of wires electrically connecting the cells of different MOSFET units in parallel.

* * * * *